(12) United States Patent
Tournier et al.

(10) Patent No.: US 12,336,307 B2
(45) Date of Patent: Jun. 17, 2025

(54) ELECTRONIC DEVICE COMPRISING A PHOTODIODE

(71) Applicant: STMicroelectronics (Crolles 2) SAS, Crolles (FR)

(72) Inventors: Arnaud Tournier, Grenoble (FR); Boris Rodrigues Goncalves, Theys (FR); Francois Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 138 days.

(21) Appl. No.: 17/848,315

(22) Filed: Jun. 23, 2022

(65) Prior Publication Data

US 2022/0320359 A1 Oct. 6, 2022

Related U.S. Application Data

(62) Division of application No. 16/825,298, filed on Mar. 20, 2020, now Pat. No. 11,417,789.

(30) Foreign Application Priority Data

Mar. 27, 2019 (FR) ...................................... 1903194

(51) Int. Cl.
  *H10F 30/225* (2025.01)
  *H10F 39/00* (2025.01)
  *H10F 39/18* (2025.01)

(52) U.S. Cl.
  CPC ........... *H10F 30/225* (2025.01); *H10F 39/18* (2025.01); *H10F 39/8027* (2025.01); *H10F 39/8033* (2025.01); *H10F 39/8037* (2025.01); *H10F 39/807* (2025.01)

(58) Field of Classification Search
  CPC ..... H01L 27/146–14893; H01L 31/103; H01L 31/107
  See application file for complete search history.

(56) References Cited

U.S. PATENT DOCUMENTS

| | | | |
|---|---|---|---|
| 6,406,972 B2 * | 6/2002 | Norstrom | H01L 21/763 257/E21.336 |
| 9,236,407 B2 * | 1/2016 | Roy | H01L 27/14656 |
| 9,793,312 B1 * | 10/2017 | Roy | H01L 27/14643 |
| 2009/0266973 A1 | 10/2009 | Roy et al. | |
| 2010/0193845 A1 | 8/2010 | Roy et al. | |
| 2011/0096208 A1 | 4/2011 | Roy et al. | |
| 2012/0018618 A1 | 1/2012 | Roy | |
| 2012/0161213 A1 | 6/2012 | Roy et al. | |
| 2017/0125474 A1 | 5/2017 | Roy et al. | |
| 2017/0194368 A1 | 7/2017 | Roy et al. | |

(Continued)

FOREIGN PATENT DOCUMENTS

| | | |
|---|---|---|
| CN | 103579223 A | 2/2014 |
| CN | 108281436 A | 7/2018 |

(Continued)

*Primary Examiner* — Mounir S Amer
(74) *Attorney, Agent, or Firm* — SEED IP LAW GROUP LLP (57) ABSTRACT

An electronic device is provided that includes a photodiode. The photodiode includes a semiconductor region coupled to a node of application of a first voltage, and at least one semiconductor wall. The at least one semiconductor wall extends along at least a height of the photodiode and partially surrounds the semiconductor region.

22 Claims, 3 Drawing Sheets

(56) References Cited

U.S. PATENT DOCUMENTS

| | | |
|---|---|---|
| 2018/0176498 A1 | 6/2018 | Elkhatib et al. |
| 2018/0315784 A1 | 11/2018 | Saxod et al. |
| 2019/0198701 A1 | 6/2019 | Moussy |

FOREIGN PATENT DOCUMENTS

| | | |
|---|---|---|
| CN | 211743157 U | 10/2020 |
| EP | 2216817 A1 | 8/2010 |
| EP | 3696865 A1 | 8/2020 |
| WO | WO 2018050996 A1 | 3/2018 |

\* cited by examiner

ELECTRONIC DEVICE COMPRISING A PHOTODIODE

BACKGROUND

Technical Field

The present disclosure generally concerns electronic devices comprising at least one photodiode.

Description of the Related Art

Photodiodes are semiconductor components each comprising a PN junction. Photodiodes have the ability of detecting a radiation in the optical domain and of transforming it into an electric signal.

Image sensors are electronic devices each comprising a plurality of photodiodes. The photodiodes enable the device to obtain an image of a scene at a given time. The image is formed of a pixel array, the information of each pixel being obtained by one or plurality of photodiodes. For example, the information generally corresponds to a quantity of electrons obtained by a photodiode at a given time, this quantity of electrons being converted by the image sensor into color levels (red, green, or blue) or into grey levels.

Electrons having been formed after the time corresponding to the image may however cause modifications in the image obtained by the sensor.

BRIEF SUMMARY

An embodiment overcomes all or part of the disadvantages of known devices comprising photodiodes.

An embodiment provides an electronic device comprising a photodiode, the photodiode comprising a region coupled to a node of application of a first voltage, the region being partially surrounded with at least one semiconductor wall extending along at least the height of the photodiode.

According to an embodiment, the photodiode is formed in a semiconductor substrate and the wall(s) extend along the entire height of the semiconductor substrate.

According to an embodiment, the wall(s) are coupled to a node of application of a second voltage.

According to an embodiment, at least one of the wall(s) is U-shaped.

According to an embodiment, the region is located in the convex region delimited by the at least one of the U-shaped wall(s).

According to an embodiment, the device comprises two walls, each being U-shaped.

According to an embodiment, the convex region delimited by each of the two walls extends in the direction of the other wall.

According to an embodiment, the device comprises at least one wall having a cuboid shape.

According to an embodiment, the region is separated from the wall(s) by an insulating trench.

According to an embodiment, the device comprises a transistor coupling, by its source and its drain, the cathode of the photodiode to a node of application of a positive voltage.

According to an embodiment, the device comprises a storage element coupled to the cathode of the photodiode.

According to an embodiment, the storage element is an electron collection area.

According to an embodiment, the device comprises at least one connection pad resting on the photodiode coupled to a node of application of a positive voltage.

Another embodiment provides a method of use of an electronic device such as previously described, the method comprising a first step during which the second voltage is a negative voltage and a second step during which the second voltage is a positive voltage.

The foregoing and other features and advantages will be discussed in detail in the following non-limiting description of specific embodiments in connection with the accompanying drawings.

DETAILED DESCRIPTION

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front," "back," "top," "bottom," "left," "right," etc., or relative positions, such as terms "above," "under," "upper," "lower," etc., or to terms qualifying directions, such as terms "horizontal," "vertical," etc., unless otherwise specified, it is referred to the orientation of the drawings.

The terms "about," "approximately," "substantially," and "in the order of" are used herein to designate a tolerance of plus or minus 10%, preferably of plus or minus 5%, of the value in question.

Figure 1:
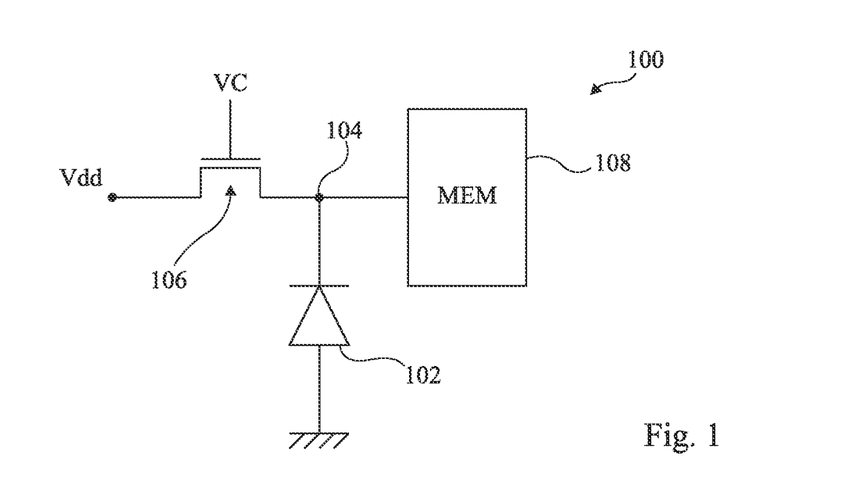
FIG. 1 schematically shows an electronic device comprising a photodiode.

FIG. 1 schematically shows an electronic device 100 comprising a photodiode 102. Device 100 is for example a portion of an image sensor, comprising a plurality of photodiodes. For example, device 100 may be repeated for each photodiode of an image sensor.

Photodiode 102 is coupled, preferably connected, between a node 104 and a node of application of a first reference voltage, for example, the ground. More precisely, the cathode of photodiode 102 is coupled, preferably connected, to node 104 and the anode of photodiode 102 is coupled, preferably connected, to the node of application of the first reference voltage.

Device 100 further comprises a switch 106, preferably a transistor, coupled between node 104 and a node of application of a second reference voltage, for example, a positive power supply voltage Vdd. Voltage Vdd is for example greater than 1 V.

Transistor 106 is for example connected to the node of application of voltage Vdd by its drain and to node 104 by its source. The gate of transistor 106 is coupled, preferably connected, to a node of application of a control voltage VC.

Node 104 is further coupled, preferably connected, to a storage element 108 MEM.

Storage element 108 is preferably an electron collection area, for example, an area made of semiconductor material, capable of keeping electrons that are formed by photodiode 102. Device 100 may comprise one or a plurality of electron collection areas 108.

In some embodiments, a method of use of device 100 comprises at least two steps, which will be described for a single device 100. In the case of an image sensor comprising a plurality of devices 100, each device 100 implements the method of use. Preferably, the plurality of devices 100 simultaneously implements each step of the method. Thus, the information supplied by each pixel 102 is representative of a same scene at a same time.

During a first step, the image of the scene is captured. More particularly, the light originating from the scene at a given time causes the forming of electrons in photodiode 102. The number of electrons provides, for example, information relative to a pixel of the image which will be obtained. The electrons are transferred, during this first step, into one or a plurality of electron collection areas, for example, forming storage element 108. Then, photodiode 102 may for example be covered.

The method may include a second step during which the quantity of electrons in the storage elements is read by an adapted circuit, not shown.

However, light may keep on reaching the photodiode, for example, if the photodiode is not covered, or if the photodiode is partially covered. Electrons then keep on being formed and risk being transferred into the electron storage area(s). The quantity of electrons would then be modified, as well as the information representative of the image, which would then no longer correspond to the image of the scene at the selected time. Switch 106 is then turned on during the second step to couple node 104 to the node of application voltage Vdd. The electrons are then attracted towards the node of application of voltage Vdd, and away from storage element 108.

As a variation, in the case where the image sensor comprises a plurality of devices 100, certain portions of devices 100 may be common to a plurality of devices 100. For example, switch 106 may be common to a plurality of devices 100, and charges or electrons generated or formed by the plurality of devices 100 may be collectively stored in the storage element 108. In such embodiments, the switch 106 may be selectively operated to pass the stored charges from the storage element 108 to the node of application of voltage Vdd.

Figure 2:
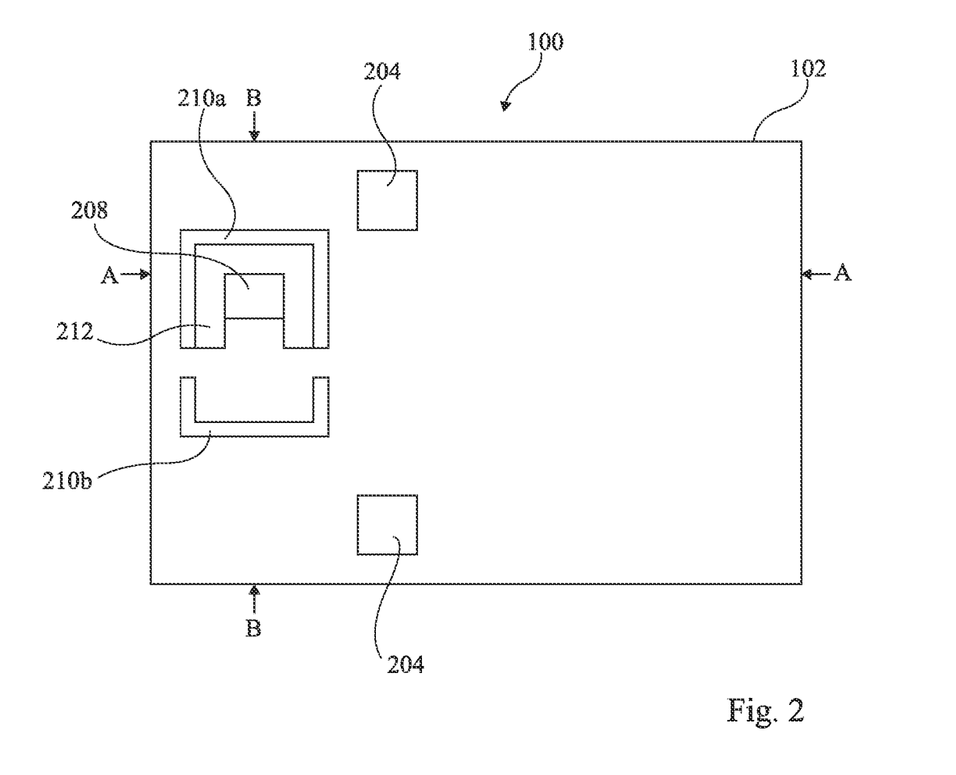
FIG. 2 schematically shows in top view an embodiment of a portion of the electronic device comprising a photodiode of FIG. 1.
Figure 3A:
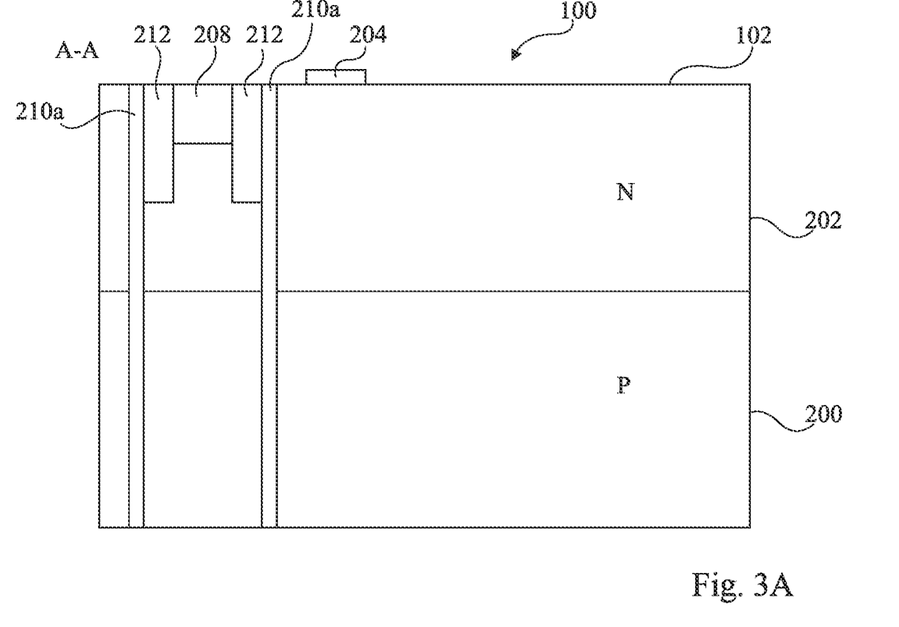
FIG. 3A is a cross-section view along plane A-A of FIG. 2
Figure 3B:
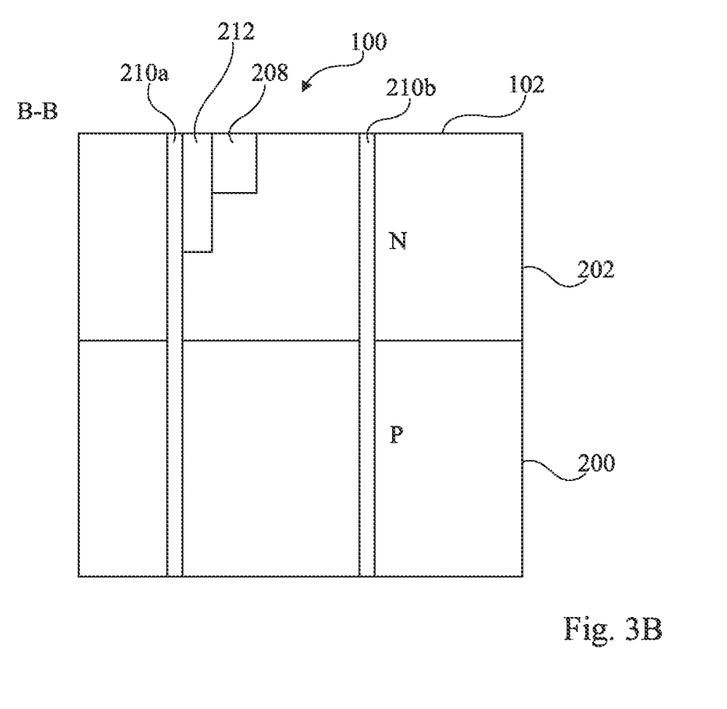
FIG. 3B is a cross-section view along plane B-B of FIG. 2.

FIG. 2 schematically shows, in top view, an embodiment of a portion of electronic device 100 comprising a photodiode 102. FIG. 3 comprises a cross-section view along plane A-A of FIG. 2 (FIG. 3A) and a cross-section view 3B along plane B-B of FIG. 2 (FIG. 3B).

Photodiode 102 comprises a PN junction in a semiconductor substrate. The photodiode 102 for example comprises a P-type semiconductor layer 200 covered with an N-type semiconductor layer 202. Layers 200 and 202 are for example made of silicon. Layer 202 thus forms the source of transistor 106, coupled to the cathode of the photodiode.

Device 100 comprises two contact pads 204, for example, located on the upper surface of photodiode 102. Pads 204 are for example located on the upper surface of semiconductor layer 202.

Contact pads 204 are for example coupled, preferably connected, to nodes of application of a control voltage. The two pads are for example coupled, each via a switch, to a same node of application of a same control voltage. The control voltage is capable of causing the movement of the electrons towards the electron collection areas. The control voltage is for example a positive voltage having a value equal to power supply voltage Vdd.

The electron collection areas are for example semiconductor regions adjacent to photodiode 102. Each contact pad 204 is preferably located opposite a contact interface between photodiode 102 and one of the electron collection areas. Except for the contact interface, photodiode 102 and the collection area are for example separated by an insulating wall or a semiconductor wall receiving a negative voltage, not shown. As a variation, a plurality of pads 204 may be located opposite a same contact interface between photodiode 102 and one of the electron collection areas.

In the example of FIGS. 2 and 3, the device comprises two pads 204 and thus for example comprises two electron collection areas. More generally, the device may comprise at least one pad 204, and thus at least one electron collection area.

During the first step, previously described, a positive voltage VP, for example, power supply voltage Vdd, is delivered to at least one of pads 204 to attract the electrons towards it and thus towards the corresponding electron collection area. In the case where there is a plurality of 204 and a plurality of electron collection areas, pads 204 for example receive the positive voltage one after the other alternately so that the electrons are partially stored in each of the electron collection areas. This enables to sample the information obtained by photodiode 102.

Connection pads 204 are for example surface elements, that is, they are in contact with a surface of photodiode 102, for example, only with the upper surface of semiconductor layer 202. For example, connection pads 204 are only in contact with photodiode 102 by a planar surface. Contact pads 204 are for example semiconductor plates or layers, for example, made of metal, resting on photodiode 102.

Device 100 further comprises a semiconductor region 208 located in photodiode 102. Region 208 is for example located in semiconductor layer 202. Region 208 is in this example of the same doping type as layer 202, for example, N-type doped. Region 208 is for example more heavily doped than semiconductor layer 204. Region 208 extends into semiconductor layer 202, for example, from the upper surface of photodiode 102, that is, for example, from the upper surface of layer 202. Region 208 preferably does not extend along the entire height of semiconductor layer 202.

Region 208 is coupled, preferably connected, to the node of application of power supply voltage Vdd. Region 208 forms the drain of transistor 106 (FIG. 1).

Device 100 further comprises two semiconductor walls 210 (210a and 210b in FIGS. 2 and 3). More generally, device 100 comprises at least one semiconductor wall 210 partially surrounding region 208. Walls 210 are for example made of an intrinsic semiconductor. Walls 210 are for example made of silicon. Walls 210 extend at least along the entire height of the photodiode, that is, along the height of layers 200 and 202. Preferably, walls 210 extend along the entire height of the substrate having photodiode 102 formed therein.

Wall 201*a* has, in top view, a U-shape. Wall 210*a* thus has a U-shaped cross-section in a plane parallel to the upper surface of layer 202. Wall 210*a* comprises two first branches substantially parallel to each other, coupled by a second branch substantially perpendicular to the first two branches.

Wall 210*b* also has, in top view, a U shape. Wall 210*b* thus has a U-shaped cross-section in a plane parallel to the upper surface of layer 202. Wall 210*b* comprises two first branches substantially parallel to each other, coupled by a second branch substantially perpendicular to the first two branches.

Preferably, the first branches of wall 210*b* are shorter than the first branches of wall 210*a*. Further, the length of the second branch of wall 210*a* is substantially equal to the length of the second branch of wall 210*b*.

The first branches of each wall 210*a* and 210*b* for example have substantially the same width. Similarly, the second branches of each wall 210*a* and 210*b* for example have the same width. Further, the first and second branches of a same wall for example have substantially the same width. This common width is for example in the range from 100 nm to 500 nm.

Walls 210*a* and 210*b* are located in front of each other. More particularly, the first branches of wall 210*a* are located in line with the first branches of wall 210*b*. Preferably, the internal region of wall 210*a* is at the surface of the internal region of wall 210*b*, that is, the first branches of walls 210*a* and 210*b* are located between the second branches of walls 210*a* and 210*b*. In other words, the convex region delimited by the U shape of each of the two walls, that is, the region located between the first branches, extends in the direction of the other wall 210.

Walls 210*a* and 210*b* are spaced apart from each other, that is, they are not in contact with each other. Walls 210*a* and 210*b* are thus separated from each other by a portion of semiconductor layers 200 and 202.

Semiconductor region 208 is located inside of the U shape of wall 210*a*, that is, between the first two branches of wall 210*a*. In other words, region 208 is located in the convex region delimited by the U shape. Region 208 is thus partially surrounded with walls 210*a* and 201*b*.

The space between the ends of the first branches of walls 210*a* and 210*b* may allow the passage of electrons in layers 200 and 202 to reach semiconductor region 208.

The length of the first branches is however preferably sufficient for a first branch to be located between region 208 and pads 204. Further, walls 210 are located between region 208 and the electron collection areas.

Walls 210 form the gate of transistor 106 (FIG. 1). Walls 210 are coupled, preferably connected, to a node of application of control voltage VC.

Region 208 is separated from wall 210*a* by an insulating trench 212. Region 208 is preferably only separated from wall 210*a* by insulating trench 212. Thus, there is preferably no portion of semiconductor layer 202 between region 208 and walls 210*a*.

Insulating trench 212 extends into semiconductor layer 202, for example, from the upper surface of semiconductor layer 202. Insulating trench 212 is at least as deep as region 208. Insulating trench 212 is preferably shallower than walls 210.

During the first previously-described step, control voltage VC is a negative voltage, for example, smaller than or equal to −1 V. Contact pads 204 receive, continuously or alternately, positive voltage VP. Thus, the electrons formed in photodiode 102 are attracted towards the electron collection areas.

During the second step, control voltage VC is a positive voltage, for example, equal to power supply voltage Vdd. Further, voltage VP is a negative voltage, for example, smaller than or equal to −0.5 V. Thus, the electrons are attracted, first, by walls 210, and then by semiconductor region 208. For this purpose, the electrons pass through the space between walls 210*a* and 210*b*. The electrons are not attracted into the electron storage areas and do not modify the quantity of stored electrons.

The interface between walls 210 and the photodiode forms a volume. Indeed, walls 210 are located in photodiode 102. A plurality of surfaces of walls 210, the lateral surfaces, are in contact with photodiode 102. Further, walls 210 are in contact with internal portions of photodiode 102. This has the advantage of attracting electrons located in the lower portion of the photodiode. Indeed, it could have been chosen to form semiconductor pads having a shape similar to that of pads 204 and located on the upper surface of photodiode 102. However, the electrons located in the lower portion of the photodiode would risk not being attracted by walls 210 and would risk being attracted into the storage elements.

As a variation, wall 210*b* may comprise no first branches. Wall 210*b* thus has the shape of a cuboid.

As a variation, device 100 may comprise a single semiconductor wall surrounding region 208 except for an opening, for example, on the side of pads 204. For example, the wall corresponds to walls 210, having its first branches most remote from pads 204 in contact to form a single branch extending from one of the second branches to the other. The separation of the other first branches is however present.

Figure 4:
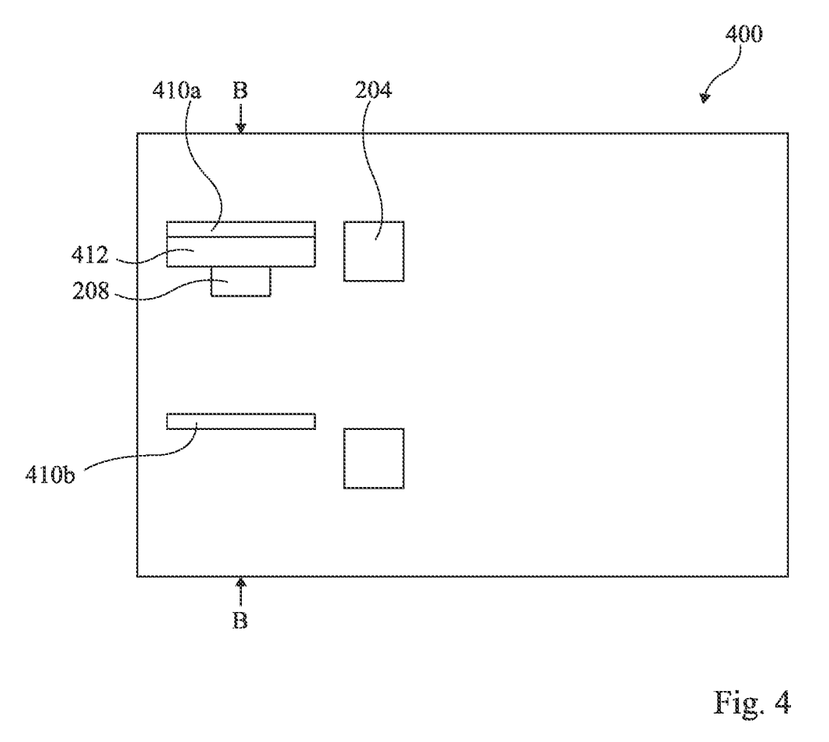
FIG. 4 schematically shows, in top view, another embodiment of an electronic device comprising a photodiode.

FIG. 4 schematically shows, in top view, another example of an electronic device 400 comprising a photodiode 102 similar to the photodiode of the embodiment of FIGS. 2 and 3. The cross-section view along plane B-B of FIG. 4 is similar to view 3B of FIG. 3. Device 400 has a structure similar to the structure of the device 100 described in FIG. 1.

Photodiode 102 comprises, as previously, a PN junction in a semiconductor substrate. The photodiode for example comprises P-type semiconductor layer 200 covered with N-type semiconductor layer 202. Layers 200 and 202 are for example made of silicon. Layer 202 also forms the source of transistor 106, in contact with the cathode of photodiode 102.

Device 400 comprises the two contact pads 204 for example located on the upper surface of photodiode 102. Pads 204 are for example located on the upper surface of semiconductor layer 202.

Contact pads 204 are for example coupled, preferably connected, to nodes of application of a control voltage. The two pads are for example coupled, each via a switch, to a same node of application of a same control voltage. The control voltage is capable of causing the movement of the electrons towards the electron collection areas. The control voltage is for example a positive voltage having a value equal to that of the power supply voltage.

The electron collection areas are for example semiconductor regions adjacent to photodiode 102. Each contact pad 204 is preferably located opposite a contact interface between photodiode 102 and one of the electron collection areas. Except for the contact interface, photodiode 102 and the collection area are for example separated by an insulating wall or a semiconductor wall receiving a negative voltage, not shown. As a variation, a plurality of pads 204 may be located opposite a same contact interface between photodiode 102 and one of the electron collection areas.

In the example of FIG. 4, as in the example of FIGS. 2 and 3, device 400, like device 100 in FIGS. 2 and 3, comprises two pads 204 and thus for example comprises two electron collection areas. More generally, device 400 may comprise at least one pad 204, and thus at least one electron collection area.

Device 400 of FIG. 4 implements the operating steps previously described in relation with FIG. 1.

During the first previously-described step, positive voltage VP, for example, power supply voltage Vdd, is delivered to at least one of pads 204 to attract the electrons towards it and thus towards the corresponding electron collection area. In the case where there is a plurality of pads 204, the pads for example alternately receive the positive voltage so that the electrons are partially stored in each of the electron collection areas. This enables to sample the information obtained by photodiode 102.

Connection pads 204 are for example surface elements, that is, they are in contact with a surface of photodiode 102, for example, only with the upper surface of semiconductor layer 202. For example, connection pads 204 are only in contact with photodiode 102 by a planar surface. Contact pads 204 are for example semiconductor plates or layers, for example, made of metal, resting on photodiode 102.

Device 400 further comprises semiconductor region 208 located in photodiode 102. Region 208 is for example located in semiconductor layer 202. Region 208 is in this example of the same doping type as layer 202, for example, N-type doped. Region 208 is for example more heavily doped than semiconductor layer 204. Region 208 extends in semiconductor layer 202, for example, from the upper surface of photodiode 102, that is, for example, from the upper surface of layer 202. Region 208 preferably does not extend along the entire height of semiconductor layer 202.

Region 208 is coupled, preferably connected, to the node of application of power supply voltage Vdd. Region 208 forms the drain of transistor 106 (FIG. 1).

Device 400 comprises, like device 100, semiconductor walls 410. Device 400 comprises two semiconductor walls 410 (410a and 410b in FIG. 4). Walls 410 are for example made of an intrinsic semiconductor. Walls 210 are for example made of silicon. Walls 410 extend at least along the entire height of the photodiode, that is, along the height of layers 200 and 202. Preferably, walls 410 extend along the entire height of the substrate having photodiode 102 formed therein.

Each of walls 410 of the example of FIG. 4 has, unlike walls 210, substantially the shape of a cuboid. Walls 410a and 410b are parallel to each other. Walls 410a and 410b for example have the shape and the location of the second branches of walls 210a and 210b of the embodiment of FIGS. 2 and 3.

Walls 410a and 410b are spaced apart from each other, that is, they are not in contact with each other. Walls 410a and 410b are thus separated from each other by a region of semiconductor layers 200 and 202.

Semiconductor region 208 is located between walls 410a and 410b, in the region of semiconductor layer 202. Region 208 is thus partially surrounded with walls 410a and 410b.

The space between walls 410a and 410b may allow the passage of electrons in layers 200 and 202 to reach semiconductor region 208.

Walls 410 form the gate of transistor 106 (FIG. 1). Walls 410 are coupled, preferably connected, to a node of application of control voltage VC.

Region 208 is separated from wall 410a by an insulating trench 412. Region 208 is preferably only separated from wall 410a by insulating trench 412. Thus, there is preferably no portion of semiconductor layer 202 between region 208 and walls 410a.

Insulating trench 412 extends into semiconductor layer 202, for example, from the upper surface of semiconductor layer 202. Insulating trench 412 is at least as deep as region 208. Insulating trench 212 is preferably shallower than walls 410.

During the first previously-described step, control voltage VC is a negative voltage, for example, smaller than or equal to −1 V. Contact pads 204 receive, continuously or alternately, positive voltage VP. Thus, the electrons formed in photodiode 102 are attracted towards the electron collection areas.

During the second step, control voltage VC is a positive voltage, for example, equal to power supply voltage Vdd. Further, voltage VP is no longer supplied to contact pads 204. Thus, the electrons are attracted, first, by walls 410, and then by semiconductor region 208. For this purpose, the electrons pass between walls 410a and 410b. The electrons are not attracted into the electron storage areas and do not modify the quantity of stored electrons.

The interface between walls 410 and the photodiode forms a volume. Indeed, walls 410 are located in photodiode 102. A plurality of surfaces of walls 410, the lateral surfaces, are in contact with photodiode 102. Further, walls 410 are in contact with internal portions of photodiode 102. This has the advantage of attracting electrons located in the lower portion of the photodiode. Indeed, it could have been chosen to form semiconductor pads having a shape similar to that of pads 204 and located on the upper surface of photodiode 102. However, the electrons located in the lower portion of the photodiode would risk not being attracted by walls 410 and would risk being attracted into the storage elements.

As a variation, the semiconductor walls may have different shapes, by partially surrounding semiconductor region 208. For example, device 400 comprises a single wall 410a and does not comprise wall 410b.

Various embodiments and variations have been described. It will be understood by those skilled in the art that certain features of these various embodiments and variations may be combined, and other variations will occur to those skilled in the art. In particular, the described embodiments may be capable of operating in equivalent fashion for holes instead of electrons.

Further, the photodiode may be different from that described. For example, it is possible for the photodiode to comprise, instead of a horizontal PN junction as in the described embodiments, a vertical PN junction.

Further, the doping types of the different described elements may be inverted.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a first semiconductor layer having a first conductivity type;
   a second semiconductor layer on the first semiconductor layer and having a second conductivity type;
   a first semiconductor wall extending through the first semiconductor layer and the second semiconductor layer;
   a second semiconductor wall extending through the first semiconductor layer and the second semiconductor layer;
   an insulating trench extending into the second semiconductor layer, the insulating trench in direct physical contact with the first semiconductor wall; and
   a semiconductor region extending into the second semiconductor layer, spaced from the first semiconductor wall by the insulating trench, and having the second conductivity type, the first semiconductor wall being spaced from the second semiconductor wall by the insulating trench and the semiconductor region.

2. The device of claim 1 wherein the second semiconductor wall is spaced from the semiconductor region by a portion of the second semiconductor layer.

3. The device of claim 1 wherein each of the first and second semiconductor walls has a cuboid shape.

4. The device of claim 1 wherein the semiconductor region extends into the second semiconductor layer to a first depth, and the insulating trench extends into the second semiconductor layer to a second depth that is at least as deep as the first depth.

5. The device of claim 1, further comprising:
   a first contact pad on the second semiconductor layer and lateral to the first semiconductor wall; and
   a second contact pad on the second semiconductor layer and lateral to the second semiconductor wall.

6. The device of claim 5 wherein the semiconductor region has a greater doping level than the each of the first and second contact pads.

7. The device of claim 1 wherein the first semiconductor layer and the second semiconductor layer are a PN junction of a photodiode.

8. The device of claim 1 wherein the first semiconductor wall and the second semiconductor wall are a gate of a transistor, the second semiconductor layer is a source of the transistor, and the semiconductor region is a drain of the transistor.

9. The device of claim 1 wherein
   the first semiconductor layer and the second semiconductor layer are a PN junction of a photodiode,
   the first semiconductor wall and the second semiconductor wall are a gate of a transistor, the second semiconductor layer is a source of the transistor, and the semiconductor region is a drain of the transistor, and
   a cathode of the photodiode is electrically coupled to the source of the transistor.

10. A device, comprising:
    a first semiconductor layer having a first conductivity type;
    a second semiconductor layer on the first semiconductor layer and having a second conductivity type, the first and second semiconductor layers forming a PN junction;
    a photodiode including the PN junction; and
    a transistor including:
    a gate including first and second semiconductor walls extending through the first semiconductor layer and the second semiconductor layer;
    a source including the second semiconductor layer;
    an insulating trench extending into the second semiconductor layer; and
    a drain including a semiconductor region extending into the second semiconductor layer, spaced from the first semiconductor wall by the insulating trench, and having the second conductivity type, the first semiconductor wall being spaced from the second semiconductor wall by the insulating trench and the semiconductor region.

11. The device of claim 10 wherein the second semiconductor wall is spaced from the semiconductor region by a portion of the second semiconductor layer.

12. The device of claim 10 wherein each of the first and second semiconductor walls has a cuboid shape.

13. The device of claim 10, further comprising:
    a first contact pad on the second semiconductor layer and lateral to the first semiconductor wall; and
    a second contact pad on the second semiconductor layer and lateral to the second semiconductor wall.

14. The device of claim 13 wherein the semiconductor region has a greater doping level than each of the first and second contact pads.

15. A device, comprising:
    a photodiode including a cathode and anode, the photodiode including a PN junction formed by a first semiconductor layer having a first conductivity type and a second semiconductor layer having a second conductivity type;
    a transistor including a gate including first and second semiconductor walls extending through the first and second semiconductor layers, a source including the second semiconductor layer, and a drain including a semiconductor region extending into the second semiconductor layer and having the second conductivity type; and
    a storage element electrically coupled to the source and the cathode.

16. The device of claim 15, further comprising:
    an insulating trench extending into the second semiconductor layer, the semiconductor region being spaced from the first semiconductor wall by the insulating trench.

17. The device of claim 16 wherein the first semiconductor wall is spaced from the second semiconductor wall by the insulating trench and the semiconductor region.

18. The device of claim 15 wherein each of the first and second semiconductor walls has a cuboid shape.

19. The device of claim 15, further comprising:
    a contact pad on the second semiconductor layer and lateral to the first semiconductor wall, the semiconductor region having a greater doping level than the contact pad.

20. The device of claim 15 wherein the drain is configured to receive a first voltage, and the gate is configured to receive a second voltage.

21. A device, comprising:
a first semiconductor layer having a first conductivity type;
a second semiconductor layer on the first semiconductor layer and having a second conductivity type;
a first semiconductor wall extending through the first semiconductor layer and the second semiconductor layer;
a second semiconductor wall extending through the first semiconductor layer and the second semiconductor layer;
an insulating trench extending into the second semiconductor layer; and
a semiconductor region extending into the second semiconductor layer, spaced from the first semiconductor wall by the insulating trench, and having the second conductivity type, the first semiconductor wall being spaced from the second semiconductor wall by the insulating trench and the semiconductor region, the first semiconductor wall and the second semiconductor wall being a gate of a transistor, the second semiconductor layer being a source of the transistor, the semiconductor region being a drain of the transistor.

22. The device of claim 21 wherein the second semiconductor wall is spaced from the semiconductor region by a portion of the second semiconductor layer.

\* \* \* \* \*